US012596262B2

(12) United States Patent
Feldman

(10) Patent No.: US 12,596,262 B2
(45) Date of Patent: Apr. 7, 2026

(54) LIGHT SOURCE SYSTEM AND METHOD

(71) Applicant: Applied Materials Israel Ltd.,
Rehovot (IL)

(72) Inventor: Haim Feldman, Nof-Ayalon (IL)

(73) Assignee: Applied Materials Israel Ltd.,
Rehovot (IL)

(*) Notice: Subject to any disclaimer, the term of this
patent is extended or adjusted under 35
U.S.C. 154(b) by 725 days.

(21) Appl. No.: 17/850,940

(22) Filed: Jun. 27, 2022

(65) Prior Publication Data

US 2023/0418081 A1     Dec. 28, 2023

(51) Int. Cl.
*G02B 27/09* (2006.01)
*G03F 1/84* (2012.01)

(52) U.S. Cl.
CPC ..... *G02B 27/0961* (2013.01); *G02B 27/0927*
(2013.01); *G03F 1/84* (2013.01)

(58) Field of Classification Search
CPC ............ G02B 27/0961; G02B 27/0927; G02B
27/0905; G02B 27/0966; G02B 27/123;
G02B 27/48; G02B 27/0916; G02B
27/0972; G02B 27/10; G03F 1/84; G03F
7/70491; G03F 7/7065; G03F 7/70666;
H01S 3/094069
USPC ........................................................ 359/642
See application file for complete search history.

(56) References Cited

U.S. PATENT DOCUMENTS

| | | | | |
|---|---|---|---|---|
| 4,521,075 A | * | 6/1985 | Obenschain ........... | G02B 27/09 |
| | | | | 359/569 |
| 2001/0019625 A1 | * | 9/2001 | Kenan ................. | G03F 7/70633 |
| | | | | 430/30 |
| 2018/0191946 A1 | * | 7/2018 | Mooney ................ | G01J 3/0224 |
| 2019/0302570 A1 | * | 10/2019 | Kumar ................... | G02F 1/365 |

FOREIGN PATENT DOCUMENTS

| | | | | | |
|---|---|---|---|---|---|
| CN | 109477970 A | * | 3/2019 | ........ | B23K 26/0006 |
| EP | 1463337 A2 | * | 9/2004 | .......... | H04N 9/3129 |
| JP | 2005277153 A | * | 10/2005 | | |

* cited by examiner

*Primary Examiner* — William R Alexander
*Assistant Examiner* — Alaina Marie Swanson
(74) *Attorney, Agent, or Firm* — Lowenstein Sandler LLP

(57)     ABSTRACT

A light source system is disclosed, the system comprises: a multimode laser unit; a first lenslet array positioned in a path of said laser beam and configured to form an array of focused spots in a selected plane downstream of said first lenslet array; a spatial filter mask carrying an array of pinholes positioned in said selected plane; a second lenslet array having spatial arrangement of lenslets similar to the first lenslet array and positioned such that said spatial filter mask is in a back focal plane of said second lenslet array, thereby collimating laser light from the array of focused spots into a corresponding array of beamlets; and a third lenslet array positioned downstream of said second lenslet array, configured for focusing said array of beamlets to form an output spot array at an exit pupil of said light source system.

19 Claims, 3 Drawing Sheets

LIGHT SOURCE SYSTEM AND METHOD

TECHNOLOGICAL FIELD

The present disclosure is in the field of light source design, and specifically relates to laser light sources configured with high etendue.

BACKGROUND

Modern electronic devices utilize microelectronic elements such as processing and memory chips. Such microelectronic devices are typically produced using photolithographic processes, in which photoresist material is layered on a wafer and exposed to illumination that develops the photoresist. Following development, the unexposed photoresist is removed, producing an image of a mask used in the illumination process. This technique enables selective etching of wafer material to a desired pattern for generating selected small-scale patterns for desired microelectronic devices.

To provide the desired etching pattern, the photoresist is typically illuminated through a selected mask (also referred to as reticle at times), having a selected pattern. Defects in the mask pattern may reduce accuracy of the printed pattern, damaging the resulting microelectronic devices due to undesired circuit structure. To this end, photolithographic masks, or other elements used in manufacturing of microelectronic devices, are typically inspected for defects and to verify the desired pattern thereof.

Aerial imaging techniques provide inspection of selected objects, including photolithography masks, semiconductor wafers and other such objects. For example, inspection of photolithography masks/reticles may be performed by simulating optical exposure characteristics used to expose photoresist during photolithographic fabrication. The optical system may use a selected set of exposure conditions, imitating the fabrication processes. The illumination conditions are used to form one or more images indicating exposure of the photoresist. The so-generated images are magnified and detected and are used to analyze mask design and structure and identify existence of defects and their locations.

Generally, the mask/reticle is placed on a sample mount, typically placed on a translation stage (e.g., x,y translation stage) and exposed to illumination that is partially transmitted through the mask to form a pattern onto a wafer plane. In inspection processes, illumination pattern of light transmitted through and/or reflected from the mask is enlarged and collected by suitable detection units such as CCD for analysis.

Such imaging techniques are also used for inspection of wafers. The use of aerial imaging techniques enables inspection of printed features on a wafer, typically directed at bright field inspection Aerial imaging techniques are directed at providing illumination conditions being similar to illumination used in fabrication processes. To this end, typical aerial imaging and inspection techniques utilize relatively wide light sources with high etendue. Such light sources may be provided using selected discharge lamps. Adjusting the size and the shape of the illumination aperture permits reproduction of the illumination and the coherence conditions of the photoresist exposure tool. In particular, the aperture is selected to set the proper coherence ratio sigma and to choose between on axis and off axis illumination, such as a quadrupole or an annular mode of illumination. The illumination and image collection conditions may be used for bright- and dark-field inspection.

As the fabricated microelectronic devices get miniaturized, the fabricated features, being features of the mask, or the resulting pattern applied to the wafer, become smaller. This requires inspection using shorter wavelengths to properly image the miniature features of the mask. At shorter wavelengths, the conventional incoherent illumination by discharge lamp does not provide sufficient brightness and laser illumination is often used. Some system configurations utilize a laser light source associated with a homogenizer configured to remove speckles generated by self-interference of laser beam.

GENERAL DESCRIPTION

As indicated above, characteristics of a light source and illumination properties affect inspection quality. While laser illumination typically provides desired brightness, a laser output beam generally has limited etendue and spreading out of the illumination beam (e.g., by using a diffuser) may generate speckles due to coherence of the laser output beam.

Various techniques are known for manipulating laser illumination beams to provide desired illumination characteristics. Typical light sources for aerial inspection techniques utilize one or more diffuser elements for enhancing etendue of the output laser illumination. The use of diffusers for spreading out coherent laser illumination generates speckles in the output light, which limits illumination quality. Such speckles are generated due to coherence of laser illumination and roughness of the diffuser surfaces (or other surfaces when used) and are seen as light and dark regions in the illumination pattern. Speckles cause problems in detection and reduce image quality, and may cause false alarms in identifying defects, as well as hide defects and desired mask pattern due to variations in contrast.

The present disclosure provides a light source system and corresponding technique, enabling the use of laser illumination to provide high brightness, while manipulating the laser beam to provide desirably high etendue of the output light. Etendue is a characterization of light in an optical system, indicating spreading of the illumination. This is typically defined by the product $S \cdot \Omega$ where S is a beam cross-section surface and $\Omega$ is angular spreading of the beam in solid angle (steradians).

The present technique utilizes a multimode laser light source, and an optical system configured to split an output light beam emitted by the multimode laser light source into a plurality of beamlets. The characteristics of the multimode laser beam and optical system are selected such that the beamlets of the plurality of beamlets are generally incoherent with respect to each other. This enables providing an extended light source having high brightness and etendue, while avoiding generation of speckles due to interference of light components.

Accordingly, the light source system and corresponding technique according to the present disclosure may be used for illumination of a sample, such as mask, reticle, wafer, or other sample types, for use in various manufacturing and fabrication techniques. The technique may be used for metrology and reticle inspection using aerial imaging inspection techniques as well as inspection of wafer pattern in bright- and dark-field conditions.

Thus, according to a broad aspect, the present disclosure provides a light source system comprising:

a multimode laser unit configured to emit a laser beam;

a first lenslet array positioned in a path of said laser beam and configured to form an array of focused spots in a selected plane downstream of said first lenslet array;

a spatial filter mask carrying an array of pinholes positioned in said selected plane;

a second lenslet array having spatial arrangement of lenslets similar to the first lenslet array and positioned such that said spatial filter mask is in a back focal plane of said second lenslet array, thereby collimating laser light from the array of focused spots into a corresponding array of beamlets; and a third lenslet array positioned downstream of said second lenslet array, configured for focusing said array of beamlets to form an output spot array at an exit pupil of said light source system.

According to some embodiments, the multimode laser unit may be characterized by beam quality factor $M^2$, and wherein a number of lenslets in said first and second lenslet arrays is $M^2$ or less.

According to some embodiments, the multimode laser unit may be characterized by beam quality factor $M^2$ of 10 or more.

According to some embodiments, the multimode laser unit may a pulsed multimode laser unit, an output laser beam of said multimode laser unit being characterized by a temporal coherence time tau being shorter with respect to pulse duration of the multimode laser unit. In some other embodiments, the multimode laser unit may be a CW laser unit having predetermined spatial and temporal coherence.

According to some embodiments, each pinhole of said array of pinholes is positioned along an optical axis of a respective lenslet of said first lenslet array, thereby filtering out beam portions having spatial frequency greater than a selected threshold determined by diameter of said pinholes.

According to some embodiments, the light source system may further comprise a beam splitting arrangement positioned downstream of said second lenslet array and configured to split the array of beamlet arrays into at least first and second replications of said array of beamlets, and a delay unit placed in a path of at least one of said first and second replications, and wherein said third lenslet array is configured for focusing said first and second replications of the array of beamlets.

According to some embodiments, the delay unit may be configured to delay light passing therethrough by time greater than a temporal coherence time tau of said multimode laser unit.

According to some embodiments, the third lenslet array may comprise a number of lenslets corresponding to a total number of light beams in said at least first and second replications of said array of beamlets.

According to some embodiments, the light source system may further comprise a light deflection unit positioned in a path of at least one of said at least first and second replications and configured to align beamlets of said at least first and second replications along a common axis.

According to some embodiments, the light deflection unit may be formed by one or more prisms positioned and oriented to align diverted beamlets of at least one of said at least first and second replications to propagate along an optical axis of the light source system.

According to some embodiments, the light source system may further comprise a variable aperture positioned at said exit pupil or a corresponding conjugate optical plane.

According to yet another broad aspect, the present disclosure provides an imaging system comprising a light source system and an imaging arrangement having an entrance pupil, the light source system comprising:

a multimode laser unit configured to emit a laser beam;

a first lenslet array positioned in a path of light emitted by the multimode laser unit and configured to form an array of focused spots in a selected plane downstream of said first lenslet array;

a spatial filter mask carrying an array of pinholes positioned in said selected plane downstream of said first lenslet array;

a second lenslet array having spatial arrangement of lenslets similar to the first lenslet array and positioned such that said spatial filter mask is in a back focal plane of said second lenslet array, thereby collimating laser light from the array of focused spots into a corresponding array of beamlets; and a third lenslet array positioned downstream of said second lenslet array, configured for focusing said array of beamlets to form an output spot array at said entrance pupil.

According to some embodiments, the imaging system may be configured for aerial inspection of a reticle, the system further comprising a sample mount configured to position a reticle for inspection at a front focal plane of said imaging arrangement, said entrance pupil being a conjugated optical plane with a back focal plane of said imaging arrangement.

According to some embodiments, the multimode laser unit may be characterized by beam quality factor $M^2$ being 10 or greater and wherein a number of lenslets in said first and second lenslet arrays is $M^2$ or less.

According to some embodiments, the spatial filter mask may comprise an array of pinholes, each pinhole being positioned along an optical axis of a respective lenslet of said first lenslet array, thereby filtering out diverging beam portions.

According to some embodiments, the imaging system may further comprise a beam splitting arrangement positioned downstream of said second lenslet array and configured to split the array of beamlet arrays into at least first and second replications of said array of beamlets, and a delay unit placed in a path of at least one of said first and second replications, and wherein said third lenslet array is configured for focusing said first and second replications of the array of beamlets.

According to some embodiments, the third lenslet array may comprise a number of lenslets corresponding to a total number of light beams in said at least first and second replications of said array of beamlets.

According to some embodiments, the imaging system may further comprise a light deflection unit positioned in a path of at least one of said at least first and second replications and configured to align beamlets of said at least first and second replications along a common axis.

According to some embodiments, the light deflection unit is formed by one or more prisms positioned and oriented to align diverted beamlets of at least one of said at least first and second replications to propagate along an optical axis of the light source system.

According to a further broad aspect, the present disclosure provides a method comprising:

Providing a light beam comprising a plurality of spatial modes from a multimode laser light source;

separating said light beam into a plurality of focused spots spatially separated points by a first array of lenses;

collecting light diverging from said plurality of focused
spots by a second array of lenses to provide an array of
collimated beamlets; and focusing said plurality of beamlets by a third array of
lenses onto a selected exit pupil to generate a plurality
of mutually incoherent point-like light sources at said
exit pupil.

According to some embodiments, the exit pupil may be an
entrance pupil of an optical system configured for illumi-
nating an object with high numerical aperture of illumina-
tion.

According to some embodiments, the method may further
comprise providing spatial filtering at focal plane of said
first array of lenses, thereby filtering out light portions
having spatial frequency greater than a selected threshold for
enhancing separation between the plurality of beam por-
tions.

According to an additional broad aspect, the present
disclosure provides a light source system comprising:

a multimode laser unit configured to emit a laser beam;

a first lenslet array positioned in a path of said laser beam
and configured to form an array of focused spots in a
selected plane downstream of said first lenslet array;

a spatial filter mask carrying an array of pinholes posi-
tioned in said selected plane; and a lenslet imaging arrangement comprises at least one
lenslet array having number and arrangement of lens-
lets corresponding with said first lenslet array, said
lenslet imaging arrangement is adapted for imaging
said array of beamlets to form an output spot array at
an exit pupil of said light source system.

BRIEF DESCRIPTION OF THE DRAWINGS

In order to better understand the subject matter that is
disclosed herein and to exemplify how it may be carried out
in practice, embodiments will now be described, by way of
non-limiting example only, with reference to the accompa-
nying drawings, in which.

DETAILED DESCRIPTION OF EMBODIMENTS

Figure 1:
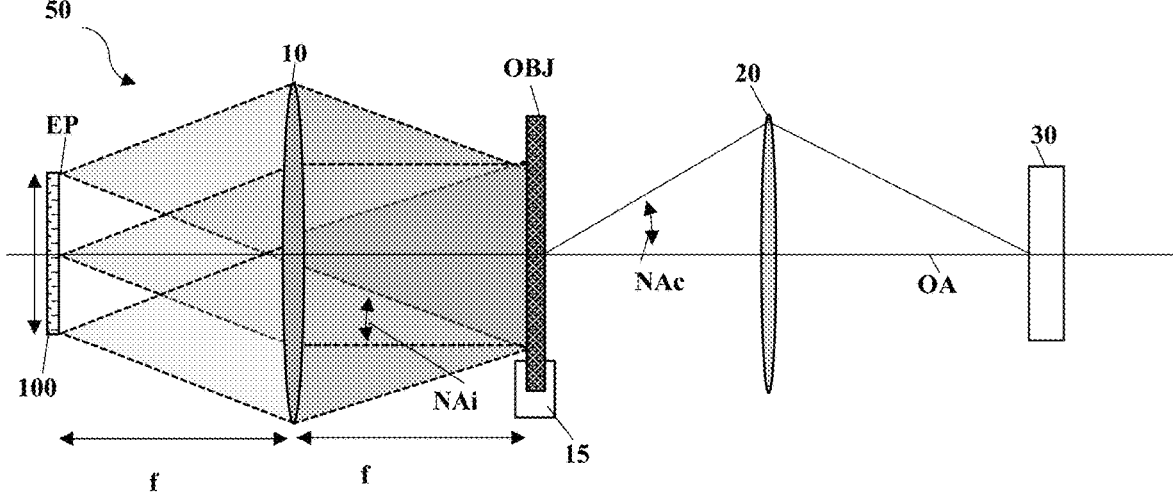
FIG. 1 schematically illustrates an aerial imaging arrange-
ment.

As indicated above, the present disclosure provides a light
source having an extended and diverging output illumination
pattern and configured to provide generally incoherent illu-
mination. In other words, the present disclosure provides a
light source having a relatively high etendue. Such light
source system may be beneficial in aerial imaging tech-
niques, such as in aerial inspection of a semiconductor wafer, a mask (e.g., lithographic mask) or other objects.
Generally, in aerial illumination, an extended light source is
placed at the back focus of a condenser lens arrangement,
where the object is placed in the front focal plane of the
condenser. A suitable optical arrangement for aerial imaging
is schematically illustrated in FIG. 1 showing system 50 for
aerial imaging of an object OBJ.

System 50 includes an extended light source 100 config-
ured to provide illumination of a selected wavelength range
(ranging between Infrared, visible range, ultraviolet wave-
lengths, etc.). The exit pupil EP of the light source 50 is
placed at a back focal plane of a condenser lens system 10
to direct illumination onto selected inspection regions of the
object OBJ. The exit pupil EP of the light source system 100
is a virtual aperture of the system, such that only light
components that pass through the exit pupil EP exit the light
source system. Typically, the exit pupil of the light source
system 100 may coincide with the entrance pupil of the
imaging arrangement provided by system 50. The exit pupil
EP may be located at the physical location of an exit aperture
of the light source system, and/or be an image of the exit
aperture. Generally, the system may also include a variable
aperture positioned at the exit pupil EP or at a conjugate
optical plane thereof. The variable aperture enables selective
variation in output beam diameter and may be used for
selectively varying spatial shape of the output beam.

The object OBJ to be inspected is placed on a sample
mount 15 (e.g., stepper chuck, sample holder, translation
stage), configured to position the object at a front focal plane
of the condenser lens system 10. For example, the object for
inspection may be a wafer, photolithographic mask/reticle,
etc. The sample mount 15 is typically controlled for selec-
tively shifting the object OBJ in two or three dimension to
enable inspection of a selected region of the object and/or to
adjust its position with respect to the front focal plane of the
condenser lens system 10. To provide imaging of the object
OBJ following the illumination by light source 100, system
50 utilizes an imaging lens arrangement 20 including one or
more lenses and configured to generate an image on a
detection plane where a detector array 30 is placed. Imaging
lens arrangement 20 may typically be configured to generate
an enlarged image of the object and may include two or more
image enlargement sections. In this connection, a condenser
lens, or condenser lens system, may be an optical arrange-
ment configured for directing a generally divergent beam
arriving from a light source to a converging beam (or
parallel/collimated beam) directed to illuminate the object
OBJ.

In some configurations, the aerial imaging system 50 may
be configured to provide two or more image replications,
e.g., using two or more focusing levels, for enhancing defect
detection ability. In such configurations, the imaging lens
arrangement 20 and/or the detector array 30 may include one
or more light splitting elements and two or more detector
arrays. Generally, each of the condenser lens system 10 and
the imaging lens arrangement 20 may include one or more
lenses, although illustrated in FIG. 1 by a single lens.
Further, the exit pupil EP of the light source system 100 may
be positioned between lenses of the condenser lens system
and/or lenses of the light source system 100.

Typically, each point of the object is illuminated by a cone
of light defining a numerical aperture for illumination NAi.
The cone of light is generally formed by light components
exiting the entire surface of the exit aperture EP. Accord-
ingly, the numerical aperture for illumination NAi is deter-
mined by effective area (diameter) of the exit aperture
providing illumination directed toward the condenser lens system 10. The value of the numerical aperture for illumination NAi is determined in accordance with a transverse dimension (diameter) of the light source system 100 at exit aperture EP thereof. More specifically, for a given condenser lens system 10, the numerical aperture NAi is proportional to effective diameter of the exit pupil EP of the light source system 100. The term effective diameter related to the diameter of the exit aperture where illumination intensity exceeds a selected threshold.

The imaging lens arrangement 20 is configured to provide an image of the object OBJ onto detector array 30. The imaging lens arrangement may generally include one or more magnification stages to provide a high resolution and high accuracy image of the object OBJ onto the detector array 30. One of the factors determining imaging quality is the numerical aperture of the imaging lens arrangement NAc. The numerical aperture for collection by the imaging lens arrangement NAc is determined by an angular aperture of the imaging lens arrangement 20 and may generally be approximated based on a relation between an aperture diameter of an entrance pupil and a focal length of the imaging lens arrangement 20.

It should be noted that FIG. 1 exemplifies transmission imagine configuration, where the imaging lens arrangement 20 and the condenser lens system 10 are positioned at opposite sides of the object OBJ. This aerial imaging configuration is suitable for mask/reticle inspection, where the collected image is indicative of illumination pattern that falls on a wafer when the mask is used for transferring the selected pattern to a wafer in photolithography. Alternatively, or additionally, such aerial imaging may utilize collection of light reflected from the object OBJ. To this end, the condenser lens system 10 and imaging lens arrangement 20 may be placed at the same side of the object. More specifically, the illumination may be directed at an angle α, and the imaging lens arrangement may be positioned to collect specular reflections, i.e., at a similar angle α. This arrangement is suitable for imaging various objects including mask/reticle, semiconductor wafer and various other objects. Placing the imaging lens arrangement along path suitable for specular reflection of illumination from the object provides conditions for bright field imaging of the object. Aerial imaging arrangement and respective light source system according to embodiments of the present disclosure may also be used in dark field imaging conditions. To this end, the imaging lens arrangement 20 is places outside path of specular reflected light from the object, to collect light components scattered from defects in the object.

The details of bright field and dark field inspection techniques are generally known and will not be discussed here in detail, but to note the following. Bright field imaging utilizes generating an image of the inspected object, based on illumination impinging thereon. The imaging lens arrangement is thus placed for collecting light reflected from the object. Dark field inspection techniques are directed for detecting defects in pattern printed on the object. To this end, the imaging lens arrangement is placed to collect light scattered from such defects, while avoid collection of specular reflection of light from the object. It should be noted that the light source system described herein is directed at providing selected dimension of exit aperture thereof, and accordingly may be used for various imaging and inspection technique including transmission imaging, reflection imaging, bright field imaging and dark field imaging. Variation and selection between the imaging and inspection techniques may be determined by relative location of the imaging lens arrangement with respect to position and orientation of the light source system described herein.

The numerical aperture NA of an optical system characterizes the range of angles of light components propagating in the optical system. In this connection, the numerical aperture for illumination NAi indicates a range of angles from which light provided by the light source system impinges on a point of the object to be inspected. Further, numerical aperture NAc of the imaging lens arrangement 20 indicates an accepted cone of light emerging from a point of the object being inspected.

In various aerial imaging or inspection techniques, the object being inspected may be a photolithographic mask or a wafer being bare or patterned. To this end, control over illumination and imaging conditions is of high importance, to accurately replicate radiation patterns (light, electromagnetic radiation of non-visible wavelengths) that are similar to those used for photolithography or other uses of the mask. In wafer inspection illumination and imaging conditions may be selected in accordance with inspection mode being bright or dark field inspection, and periodicity of patterns that may already be printed on the wafer. One of the important characteristics in aerial imaging is the coherence of illumination, typically determined as σ=NAi/NAc. Accordingly, controlling the diameter of the exit pupil EP of the light source system 100, e.g., by variation of an exit aperture diameter, enables selection of an efficient lighting characteristic, determining optical resolution and coherence of illumination for aerial imaging and inspection systems.

Various known light source configurations for use in aerial imaging techniques are based on lamp design. Suitable lamps provide generally incoherent illumination where the wavelength range can be selected using a prism and/or wavelength selective filter. The exit pupil diameter may be controlled by various techniques including, e.g., variation iris/aperture. However, lamp based light sources are generally limited in brightness and in energetic efficiency.

Laser light sources typically provide high brightness, but relatively small beam diameter and small etendue. More specifically, the product of beam cross-section and angle of divergence in a laser output beam is generally constant and increasing the cross-section of the beam typically reduces its divergence angle. This generally preserves low etendue characteristics of laser beams. The use of diffusers may provide increased and adjustable beam cross-sectional diameter, to provide an exit pupil of desired dimension. However, the use of diffusers may often introduce speckles due to self-interference of light components. Various techniques for reducing speckle contrast are used. Some of these techniques are directed at reducing coherence of the laser beam, which reduces speckle contrast. Generally, each of these techniques has its limitations and complexities.

Figure 2:
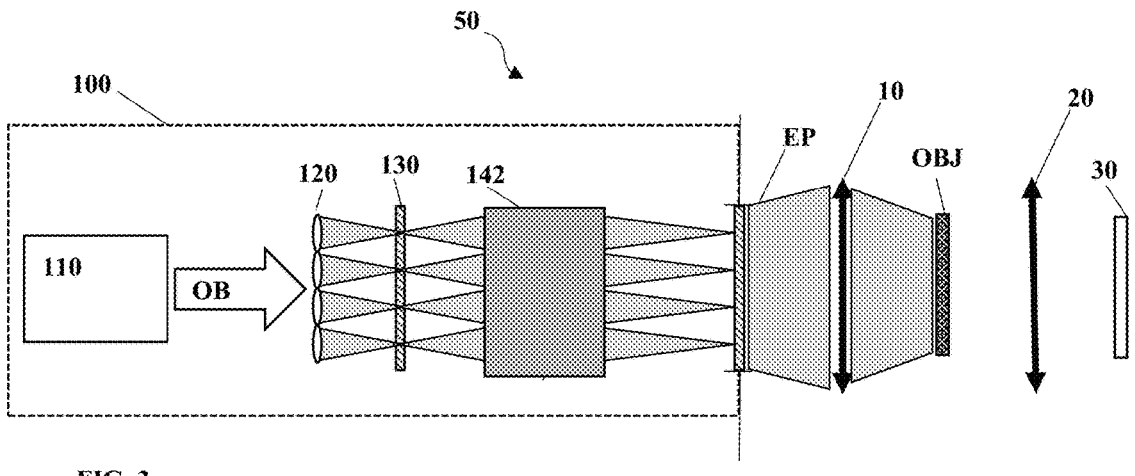
FIG. 2 illustrates an aerial imaging arrangement using
light source unit according to some embodiments of the
present disclosure.

As indicated above, the present disclosure provides a light source system configured with a high etendue and/or desirably large cross-section diameter of output light (exit pupil cross-section). The light source system is based on a multimode laser unit providing output beam that contains light components associated with a plurality of spatial and/or longitudinal lasing modes of the laser unit. The multimode laser unit may have reduced coherence relation between spatial and/or temporal modes of the output light components. Reference is made to FIG. 2 illustrating schematically a light source system 100 according to some embodiments of the present disclosure. Light source system 100 is configured for operating with a multimode laser unit 110, providing an output beam OB having a selected wavelength range and a selected $M^2$ factor. The light source system 100 includes at least a first lenslet array 120, and a lenslet imaging arrangement 142. The output beam OB emitted by the multimode laser unit 110 is directed at the first lenslet array 120 having a selected focal length of the lenslets thereof. The first lenslet array 120 focuses beam portions onto a plurality of focusing points at a selected optical plane downstream of the first lenslet array 120. Generally, the laser output beam OB may be collimated, causing the selected optical plane to coincide with front focal plane of the first lenslet array 120, accordingly, it is described as front focal plane. It should however be noted that the plurality of focusing points may be generated at any selected plane, and arrangement and positions of other elements as described herein relate to the selected plane as front focal plane of the first lenslet array 120. The light source system 100 may also include a spatial filter 130, positioned at the front focal plane of the first lenslet array and configured to block light components outside of the plurality of focus points. The spatial filter 130 may be formed of a light blocking material, having an array of a plurality of pinholes arranged to place the pinholes facing respective lenslets of the first lenslet array 120. In other words, each pinhole of the spatial filter 130 is placed along optical axis associated with a respective lenslets of lenslet array 120. Generally, all lenslet arrays used in the present technique may be microlens array, or other types of array of lenses having dimensions and optical characteristics selected in accordance with beam diameter and desired physical size of the system.

The lenslet imaging arrangement 142 is configured to provide imaging of the plurality of focus points, from front focal plane of the first lenslet array 120 onto a selected plane acting as exit pupil EP of the light source system 100. Generally, when used to provide illumination for aerial imaging/inspection, the exit pupil EP of the light source system coincides with entrance pupil of a condenser lens arrangement 10 directing illumination onto a sample. More specifically, lenslet imaging arrangement 142 may include one or more lenslet arrays, aligned with respect to first lenslet array 120 to provide imaging of the plurality of focus points generated by first lenslet array 120 onto exit pupil EP, while avoiding mixing between light components of the different focus points. Accordingly, the lenslets of lenslet imaging arrangement 142 are each aligned with respect to corresponding lenslets of first lenslet array 120. Thus, the exit pupil EP, which may also act as entrance pupil of condenser lens arrangement 10, is provided with an illumination pattern in the form of a plurality of point-like light sources (e.g., a spot array) being generally incoherent between them.

Generally, the parameter $M^2$ is known as beam quality factor or beam propagation ratio. $M^2$ provides indication regarding a beam quality of a laser system and specifically indicates a degree of deviation from an ideal Gaussian beam. While single mode laser units can provide output beams that are relatively close to the ideal Gaussian beam, i.e., having $M^2$ parameter of unity or close to unity, the output beam OB of a multimode laser unit generally includes a plurality of transverse spatial modes that affect spatial structure of the laser beam. Accordingly, the output laser beam has spatial cross-section that does not behave as Gaussian beam and is indicated by greater $M^2$. Generally, the multimode laser unit 110 may be selected to provide output beam OB having $M^2$ value of 10 of greater, or preferably of 20 or greater.

The multimode laser unit 110 and may also be selected to emit output beam OB having a plurality of longitudinal (wavelength) modes. The longitudinal modes generally do not affect beam cross-section (and thus do not affect $M^2$), but introduce additional wavelength to the output beam OB. An output beam that includes additional wavelengths, i.e., having broader emission spectrum with respect to narrow spectrum associated with single wavelength, reduces temporal coherence of the beam in addition to spatial coherence.

The laser unit 110 output beam may be transmitted through one or more optical elements prior to the first lenslet array 120. Such optical elements are not illustrated in the figure and may be configured to manipulate beam waist diameter in accordance with a diameter of the lenslets of array 120. Generally, output beam OB diameter may be selected/adjusted so that the beam OB is transmitted through a selected number of lenslets within the array 120.

The multimode laser unit 110 emits the output beam OB containing a plurality of spatial modes. Thus, the output beam OB is formed as a sum of the plurality of spatial modes contained thereon, where each mode has respective parameters such as transverse wave vector and a spatial structure. Laser modes are often numbered as $TEM_{mnq}$ where m, n and q are integers such as $TEM_{00q}$, $TEM_{01q}$, $TEM_{10q}$, $TEM_{02q}$, etc. Parameters m and n indicate the transverse mode, and parameter q indicates a longitudinal mode. Generally, different modes of a laser may be associated with a variation in wavelength. A variation of transverse wave vector between the spatial or longitudinal modes indicates a corresponding variation in phase accumulation of the different modes. Thus, dividing spatial portions of the output beam into separated point source-like pattern generates different regions that are incoherent to each other. This enables reducing coherence of the output light at the same time as generating a relatively wide illumination pattern. In other words, the multimode laser unit 110 may be selected such that a spatial coherence length of the multimode laser is short with respect to a beam diameter. Therefore, a beam section may contain a plurality of regions that, when separated, are incoherent with each other. The incoherent regions in the beam may generate an array of spots incoherent with each other using the lenslet array and imaging arrangement described herein above.

Figure 3:
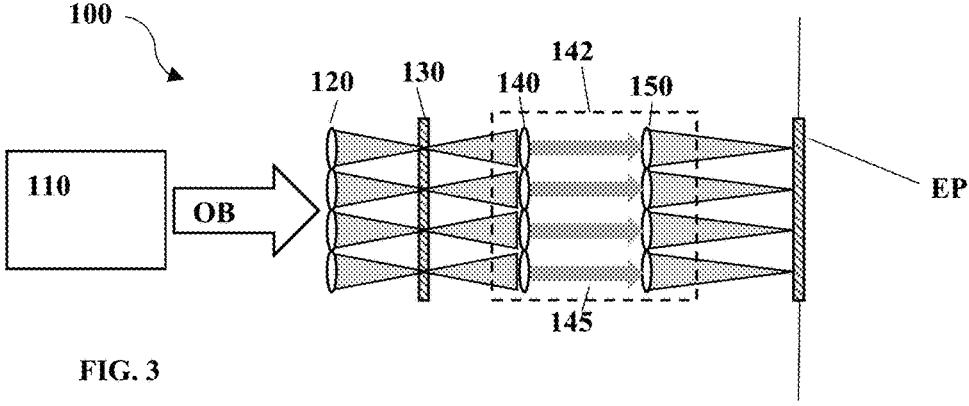
FIG. 3 illustrates a light source configuration according to
some embodiments of the present disclosure.

A specific example of a light source system 100 configuration is illustrated in FIG. 3. As shown in FIG. 3, the multimode laser unit 110 is operated to emit an output multimode beam OB. The beam OB provided by the laser is transmitted through a first lenslet array 120 generating a plurality of focus points at the back focal plane thereof. The lenslet imaging arrangement 142 includes a second lenslet array 140 and a third lenslet array 150, together operating to image the plurality of focus points onto exit pupil EP. The second lenslet array 140 and third lenslet array 150 generally have a similar number and arrangement of lenses as the first lenslet array 120 and are aligned with respect to the first lenslet array 120, to avoid mixing of separate beamlets. The first and second lenslet arrays 120 and 140 are positioned along a common optical axis, having a distance between them equal to f1+f2 where f1 is focal length of lenses of the first lenslet array 120 and f2 is the focal length of the lenses of second lenslet array 140. This configuration provides an array of generally collimated beamlets 145 exiting from the second lenslet array 140. To provide suitable light source characteristics, a third lenslet array 150 is placed upstream of the first and second lenslet arrays 120 and 140. The third lens let array 150 is placed at a focal length distance from a selected exit pupil EP of the light source system, to thereby focus the plurality of beamlets 145 onto an optical plane defining the exit pupil EP.

Selection of focal length of the third lenslet array 150 enables adjustment of etendue of the light source system 100. More specifically, using third lenslet array 150 having long focal length causes relatively low divergence of light downstream of exit pupil EP. This is while selection of third lenslet array 150, having short focal length, provides increased divergence of light out of each of the focusing points at the exit pupil, indicating greater etendue of the light source system 100.

Also shown in FIG. 2 is a spatial filter mask 130 that may be positioned between first 120 and second 140 lenslet arrays. The filter 130 is placed at front focal plane of the first lenslet array 120 and at back focal plane of the second lenslet array 140. Filter 130 generally includes an arrangement of pinholes, each positioned on the optical axis of a respective lenslet of the first 120 and second 140 lenslet arrays. The filter 130 is configured to filter out non-collimated light components of the output beam OB.

Generally, the number of lenslets in each of the first 120, second 140 and third 150 lenslet arrays may be selected in accordance with $M^2$ parameter of output beam OB of the multimode laser unit 110. More specifically, in some embodiments, the effective number of lenslets, that participate in collection of output beam OB in accordance with lenslets and beam diameters, does not exceed $M^2$ value. For example, for output beam OB having $M^2=20$, the lenslet arrays may be formed with 10-20 lenses, such that number of lenslets of the array 120 may be up to $M^2$ value. As indicated above, the beam parameter ratio $M^2$ of a multimode laser beam provided by a laser unit 110 is a measure of beam quality, and generally indicates variation from a Gaussian beam. The high beam parameter $M^2$ indicated that the output beam OB includes light components occupying a plurality of spatial laser modes. Accordingly, the arrangement of lenslet arrays 120 and 140 provides a plurality of modes that are spatially separated from each other, reducing coherence between the different beamlets.

The optical arrangement of the light source system 100 thus includes an arrangement of microlens arrays arranged to separate the output beam OB into a plurality of beamlets that are generally incoherent between them. The system is further configured to focus the plurality of beams to form an array of focal points at a plane associated with exit pupil plane EP of the system 100. This configuration provides an extended light source having a selected wavelength range, selected exit pupil diameter and selected etendue, selected in accordance with focal length of the third lenslet array 150 of lenslet imaging arrangement 142. Incoherence between the plurality of beams provides for eliminating, or at least significantly reducing, any speckle generation that may limit illumination quality. This is due to reduced coherence between light portions provided by the light source system 100 and due to omitting the need to use a diffuser.

Generally, the output beam OB of the multimode laser unit 110 is preferably substantially collimated. Additionally, as indicated above, output beam OB may be transmitted through an optical arrangement to provide an increased beam waist upstream of the optical arrangement of extended light source 100 to allow light components passage through a selected number of lenslets of the first lenslet array 120. Additionally, output exit pupil EP may be magnified by suitable optical arrangement to provide desired cross section of illumination. Further, light source system 100 may include a tunable aperture unit, enabling to selectively limit diameter of the exit pupil.

Figure 4:
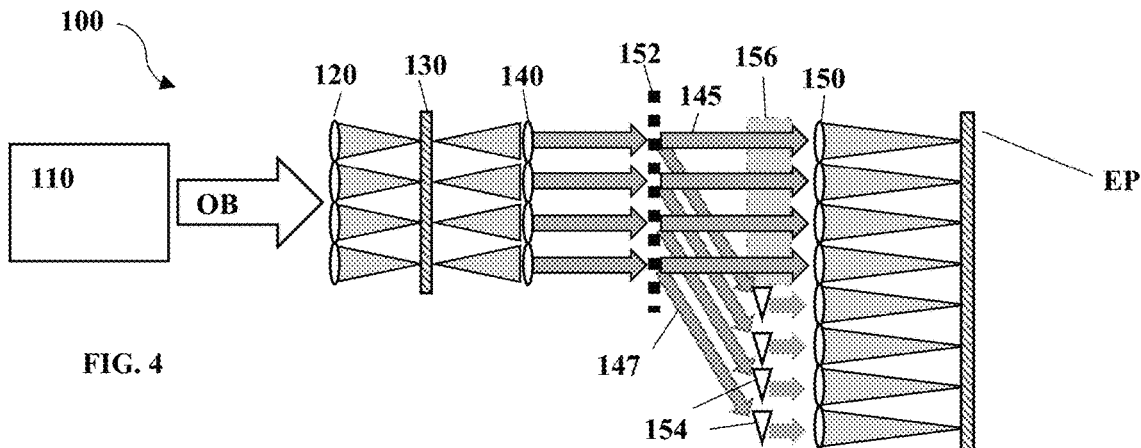
FIG. 4 illustrates another light source configuration, pro-
viding additional enlargement of the beam diameter, accord-
ing to some embodiments of the present disclosure.

Reference is made to FIG. 4 illustrating an additional embodiment according to the present disclosure. This configuration enables further increase in size of the exit pupil EP for illumination with a large cross-section light source. In this configuration, a diffraction grating 152 is placed within lenslet imaging arrangement 142 in the path of the plurality of beamlets, between the second 140 and third 150 lenslet arrays. The diffraction grating 152 may for example be a Dammann grating, having a binary phase periodic structure. Diffraction grating 152 is configured to divert portions of light passing therethrough into a one- or two-dimensional array of light beams. Accordingly, the diffraction grating 152 has a periodicity and an aperture arrangement selected to divert at least one portion 147 of the beamlets in a selected angular shift with respect to the optical axis of the light source system, in one or more directions. Light source system 100 may also include a light deflecting element 154 (e.g., a prism or an array of prisms) positioned in an optical path of the diverted beamlets 147 and configured to align the diverted beamlets 147 along a general propagation axis of the system 100.

To avoid interferences between light components of the diverted beamlets 147 and the beamlets 145 that are not diverted, the system may further include a delay line 156 positioned in an optical path of beamlets 145. Generally, delay line 156 may alternatively be placed in the path of the diverted beamlets 147. Further, a selected number of delay lines 156 may be used for a corresponding number of copies of the initial number of beamlets 145 (e.g., formed by the one or more diffraction gratings 152). The delay line 156 is used to reduce coherence between the beamlets 145 and the diverted beamlet copies 147 by generating a time delay between them. In this configuration, a portion of beamlets 145 that continue along optical axis may be considered as first replication, and the beamlets 147 that are initially diverted from the optical axis and are aligned to the optical axis using prisms 154, may be considered a second replication of the plurality of beamlets.

The use of delay line 156 provides for reducing coherence between beamlet copies. The delay line 156 is typically selected to have an optical path longer than the coherence length of multimode laser unit 110. Generally, multimode laser unit 110 may provide an output beam having a plurality of longitudinal modes, differing between them in wavelength, due to a different number of wavelengths that fit inside the cavity of the multimode laser unit 110. In this connection, a laser cavity may support a plurality of wavelengths, and in accordance with the gain medium used in the laser unit 110 and optical design thereof, output beam OB may include a plurality of longitudinal modes, as well as transverse spatial modes. A delay of the order of coherence time of the laser unit can be used to reduce coherence between the beamlet replications to eliminate, or at least significantly reduce, speckles formed by interference between light components.

This configuration enables to multiply the size of illumination exit pupil EP along a selected axis. Further, the number of gratings 152 and their arrangement may be selected in accordance with dimension and shape of desired exit pupil EP. In general, the use of beamlet duplications enables to increase the number of beamlets over the value of $M^2$ parameter, while maintaining relative incoherence between the beamlets.

Figure 5:
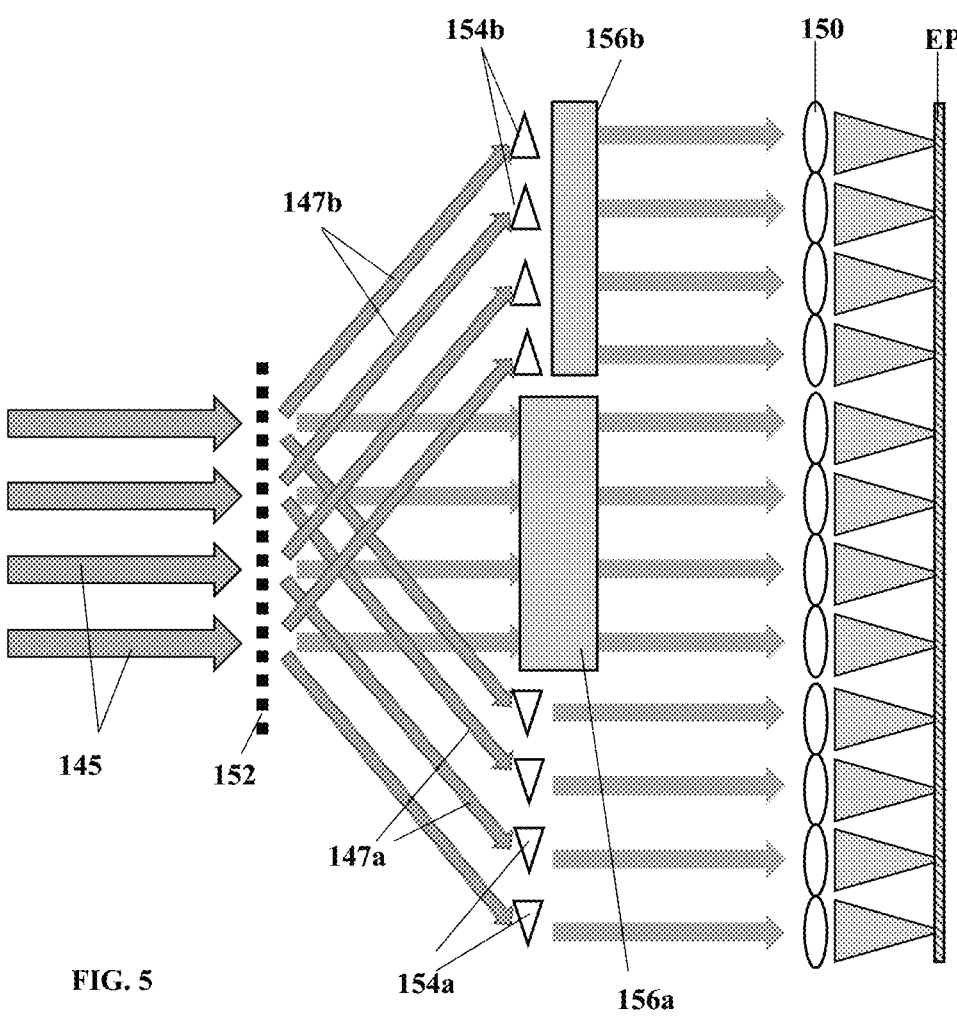
FIG. 5 illustrates a portion of a light source system
configuration according to some embodiments of the present
disclosure, using a diffraction grating for splitting a plurality
of beamlets into three replications.

As indicated above, diffraction grating 152 may be configured as a Dammann grating, including a binary phase pattern selected to divert a portion of beamlets 145. The pattern of diffraction grating 152 may be a one-dimensional pattern $g(x)$ or $g(y)$ selected to divert a portion of beamlets 145 in one direction. Additionally, or alternatively, diffraction pattern 152 may include a two-dimensional pattern $G(x,y)$, typically being separable such that $G(x,y)=g1(x)g2$ (y). Such two-dimensional diffraction grating diverts a portion of light along one traverse axis (e.g., in x axis) and another portion of light in orthogonal transverse axis (e.g., in y axis) to form a two-dimensional array of beamlet replications. In configurations where the diffraction grating 152 generates two or more beamlet replications, additional delay lines 156 may preferably be used, in a path of the selected beamlet replications, to delay the light of each replication and reduce temporal coherence between the different beamlet replications. FIG. 5 exemplifies a section of the light source system, showing beamlets 145 directed onto a diffraction grating 152 configured to divert light portions into two additional beamlet replications 147a and 147b, thus generating three beamlet replications. As shown, each set of beamlet replications is delayed by selected different optical path length using a delay line (e.g., transparent material having a selected refractive index and length along the optical path) having a different length, using first delay line 156a and second delay line 156b. As shown, the number of delay lines 156a and 156b may be determined as one less the number of beamlet replications.

Accordingly, the present disclosure provides a light source system configured to provide spread output illumination having desired etendue and exit pupil diameter, while eliminating, or at least significantly reducing, generation of speckles. The present technique may be used in various applications including, but not limited to, aerial imaging and inspection of various objects, including photolithographic masks, wafers and other fabricated articles or fabrication tools. The light source system may be operated with any selected wavelength range, including optical wavelengths, infrared wavelengths, ultraviolet wavelengths including wavelength range between 10 and 400 nm, Vacuum UV wavelength range (100-200 nm), UV-A, UV-B, UV-C, X-ray wavelength range, etc. Selection of lenslet array materials, laser unit 110, and any other generally transparent element of the system is selected in accordance with the desired wavelength for operation. For example, for UV wavelength ranges the optical elements including lenslet array may be formed of fused silica, quartz crystal, Magnesium Fluoride (MgF2), Calcium Fluoride (CaF2), Sapphire (Al2O3), BK7 Glass, and other suitable materials. It should be noted that material selection is generally associated with choice wavelength, performance and budget requirements of the system, and the present disclosure is generally not limited to material selection.

Figure 6:
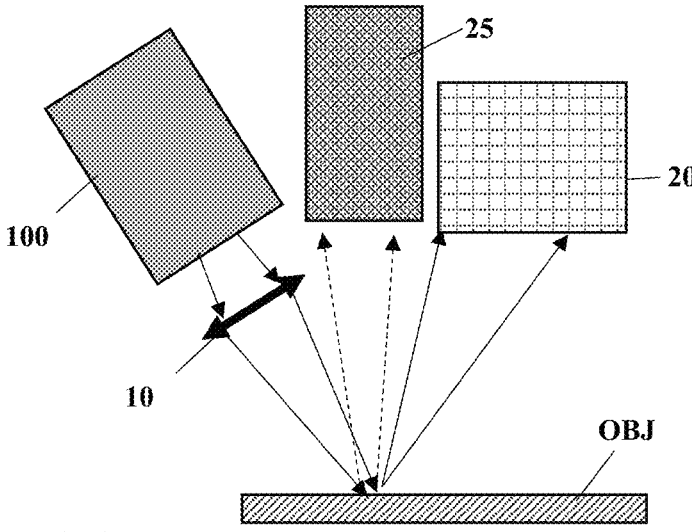
FIG. 6 illustrated an imaging system using the light source
system according to some embodiments of the present
disclosure and operating for imaging of reflected illumina-
tion in bright or dark field configurations.

Reference is made to FIG. 6 exemplifying additional configurations for imaging or inspection systems using the light source system of the present disclosure. FIG. 6 shows a light source system 100 as described above, positioned to provide illumination of an object OBJ, and two imaging arrangement 20 and 25 configured for collecting light from the object. Output illumination from the light source system 100 is directed by condenser lens arrangement 10 toward the sample OBJ being inspected. Imaging arrangement 20 is positioned in path of specular reflection of light from the object to provide bright field imaging of the object and imaging arrangement 25 is positioned outside of path of specular reflections to collect light scattered from defects on the object in dark field imaging mode. These are additional imaging configurations to that illustrated in FIG. 1 exemplifying transmitting mode imaging configuration. It should be noted that geometrical placement of the elements illustrated in FIG. 6 is exemplary only and various other spatial arrangement of light source and imaging arrangement are known in the art and suitable for use with the light source system of the present disclosure.

Generally, imaging arrangement 20 and 25 may each include one or more lens arrangements and one or more detection units, e.g., including detector array such as CCD or other detector configurations. Imaging arrangement 20 and 25 may also include filters, mirror, or other elements for improving imaging conditions of the inspected region on the sample OBJ.

It is to be noted that the various features described in the various embodiments can be combined according to all possible technical combinations.

It is to be understood that the invention is not limited in its application to the details set forth in the description contained herein or illustrated in the drawings. The invention is capable of other embodiments and of being practiced and carried out in various ways. Hence, it is to be understood that the phraseology and terminology employed herein are for the purpose of description and should not be regarded as limiting. As such, those skilled in the art will appreciate that the conception upon which this disclosure is based can readily be utilized as a basis for designing other structures, methods, and systems for carrying out the several purposes of the presently disclosed subject matter.

Those skilled in the art will readily appreciate that various modifications and changes can be applied to the embodiments of the invention as hereinbefore described without departing from its scope, defined in and by the appended claims.

What is claimed is:

1. A light source system comprising:
   a multimode laser unit configured to emit a laser beam;
   a first lenslet array positioned in a path of said laser beam and configured to form an array of focused spots in a selected plane downstream of said first lenslet array;
   a spatial filter mask carrying an array of pinholes positioned in said selected plane;
   a second lenslet array having spatial arrangement of lenslets similar to the first lenslet array and positioned such that said spatial filter mask is in a back focal plane of said second lenslet array, thereby collimating laser light from the array of focused spots into a corresponding array of beamlets; and
   a third lenslet array positioned downstream of said second lenslet array, configured for focusing said array of beamlets to form an output spot array at an exit pupil of said light source system,
   wherein the system further comprises a beam splitting arrangement positioned downstream of said second lenslet array and configured to split the array of beamlet arrays into at least first and second replications of said array of beamlets, and a delay unit placed in a path of at least one of said first and second replications, wherein the delay unit is configured to delay light passing therethrough by time greater than a temporal coherence time tau of said multimode laser unit, and wherein said third lenslet array is configured for focusing said first and second replications into mutually incoherent spot arrays enabling adjustment of at least etendue and exit pupil diameter of the light source system.

2. The light source system of claim 1, wherein said multimode laser unit is characterized by beam quality factor $M^2$, and wherein a number of lenslets in said first and second lenslet arrays is $M^2$ or less.

3. The light source system of claim 2, wherein said multimode laser unit is characterized by beam quality factor $M^2$ being 10 or more.

4. The light source system of claim 1, wherein said multimode laser unit is a pulsed multimode laser unit, an output laser beam of said multimode laser unit being characterized by a temporal coherence time tau being shorter with respect to pulse duration of the multimode laser unit.

5. The light source system of claim 1, wherein each pinhole of said array of pinholes is positioned along an optical axis of a respective lenslet of said first lenslet array, thereby filtering out beam portions having spatial frequency greater than a selected threshold determined by diameter of said pinholes.

6. The light source system of claim 1, further comprising a light deflection unit positioned in the path of at least one of said at least first and second replications and configured to align beamlets of said at least first and second replications along a common axis.

7. The light source system of claim 6, wherein said light deflection unit is formed by one or more prisms positioned and oriented to align diverted beamlets of the at least one of said at least first and second replications to propagate along an optical axis of the light source system.

8. The light source system of claim 1, further comprising a variable aperture positioned at said exit pupil or a corresponding conjugate optical plane.

9. An imaging system comprising a light source system and an imaging arrangement having an entrance pupil, the light source system comprising:

a multimode laser unit configured to emit a laser beam;

a first lenslet array positioned in a path of light emitted by the multimode laser unit and configured to form an array of focused spots in a selected plane downstream of said first lenslet array;

a spatial filter mask carrying an array of pinholes positioned in said selected plane downstream of said first lenslet array;

a second lenslet array having spatial arrangement of lenslets similar to the first lenslet array and positioned such that said spatial filter mask is in a back focal plane of said second lenslet array, thereby collimating laser light from the array of focused spots into a corresponding array of beamlets; and a third lenslet array positioned downstream of said second lenslet array, configured for focusing said array of beamlets to form an output spot array at said entrance pupil, wherein the imaging system further comprises a beam splitting arrangement positioned downstream of said second lenslet array and configured to split the array of beamlet arrays into at least first and second replications of said array of beamlets, and a delay unit placed in a path of at least one of said first and second replications, wherein the delay unit is configured to delay light passing therethrough by time greater than a temporal coherence time tau of said multimode laser unit, and wherein said third lenslet array is configured for focusing said first and second replications to generate a plurality of mutually incoherent point-like light sources enabling adjustment of at least etendue and exit pupil diameter.

10. The imaging system of claim 9, configured for aerial inspection of a reticle, the system further comprising a sample mount configured to position the reticle for inspection at a front focal plane of said imaging arrangement, said entrance pupil being a conjugated optical plane with a back focal plane of said imaging arrangement.

11. The imaging system of claim 9, wherein said multimode laser unit is characterized by beam quality factor $M^2$ being 10 or greater and wherein a number of lenslets in said first and second lenslet arrays is $M^2$ or less.

12. The imaging system of claim 9, wherein said spatial filter mask comprises an array of pinholes, each pinhole being positioned along an optical axis of a respective lenslet of said first lenslet array, thereby filtering out diverging beam portions.

13. The imaging system of claim 11, further comprising a light deflection unit positioned in the path of at least one of said at least first and second replications and configured to align beamlets of said at least first and second replications along a common axis.

14. The imaging system of claim 13, wherein said light deflection unit is formed by one or more prisms positioned and oriented to align diverted beamlets of the at least one of said at least first and second replications to propagate along an optical axis of the light source system.

15. A method comprising:

providing a light beam comprising a plurality of spatial modes from a multimode laser light source;

separating said light beam into a plurality of focused spots spatially separated points by a first array of lenses;

collecting light diverging from said plurality of focused spots by a second array of lenses to provide an array of collimated beamlets;

splitting said array of collimated beamlets into at least first and second replications of said array of collimated beamlets, and delaying at least one of said first and second replications by a time exceeding a coherence time of the multimode laser; and focusing said at least first and second replications of beamlets by a third array of lenses onto a selected exit pupil to generate a plurality of mutually incoherent point-like light sources at said exit pupil, wherein a number of replications, and focal length of the third array of lenses provides a desired exit pupil diameter and etendue of illumination.

16. The method of claim 15, wherein said exit pupil is an entrance pupil of an optical system configured for illuminating an object with high numerical aperture of illumination.

17. The method of claim 15, further comprising providing spatial filtering at a focal plane of said first array of lenses, thereby filtering out light portions having spatial frequency greater than a selected threshold for enhancing separation between a plurality of beam portions.

18. The light source system of claim 1, wherein a focal length of the third lenslet array and a number of replications define an exit pupil diameter and etendue of the light source system.

19. The imaging system of claim 9, wherein a focal length of the third lenslet array and a number of replications define an exit pupil diameter and etendue of the light source system.

* * * * *